United States Patent [19]
Csillag

[11] 3,951,701
[45] Apr. 20, 1976

[54] MASK FOR USE IN PRODUCTION OF SEMICONDUCTOR ARRANGEMENTS

[75] Inventor: Andreas Csillag, Leingarten, Germany

[73] Assignee: Licentia Patent-Verwaltungs-G.m.b.H., Frankfurt am Main, Germany

[22] Filed: Mar. 19, 1975

[21] Appl. No.: 560,082

[30] Foreign Application Priority Data
Mar. 29, 1974 Germany............................ 2415290

[52] U.S. Cl............................... 148/187; 29/579; 156/16; 156/17; 427/282; 428/156
[51] Int. Cl.².......................................... H01L 21/283
[58] Field of Search ............. 148/187, 174; 29/579; 156/8, 11, 16, 17; 427/282; 428/156

[56] References Cited
UNITED STATES PATENTS

| | | | |
|---|---|---|---|
| 3,133,336 | 5/1964 | Marinace ..................... | 148/187 UX |
| 3,144,366 | 8/1944 | Rideout et al. .............. | 148/187 UX |
| 3,697,318 | 10/1972 | Feinberg et al................... | 156/17 X |
| 3,783,044 | 1/1974 | Cheskis et al................... | 148/174 X |
| 3,824,014 | 7/1974 | Abita ............................... | 156/11 X |

OTHER PUBLICATIONS

Stevens et al., "Precise Symmetrical Alignment, Etc.," IBM Tech. Disc. Bull., Vol. 14, No. 3, Aug. '71, pp. 749, 750.

Rosvold et al., "Air–Gap Microcircuits, Etc.," IEEE Transactions on Electron Devices, Vol. Ed. 15, No. 9, 9/68, pp. 640–644.

Primary Examiner—L. Dewayne Rutledge
Assistant Examiner—J. M. Davis
Attorney, Agent, or Firm—Spencer & Kaye

[57] ABSTRACT

A mask for use in production of semiconductor arrangements comprises a mask element with projections thereon at a side adapted to face the semiconductor arrangement, the projections being adapted to cooperate with recesses in the semiconductor arrangement to locate the mask element thereon.

The invention also includes a method of producing the semiconductor arrangements.

8 Claims, 4 Drawing Figures

MASK FOR USE IN PRODUCTION OF SEMICONDUCTOR ARRANGEMENTS

BACKGROUND OF THE INVENTION

The invention relates to a mask for the construction of a semiconductor arrangement, particularly an evaporation mask for a semiconductor chip.

Masks with a certain structure are required for the production of metal contacts or the covering layers on a semiconductor chip. As a rule, there are on a semiconductor chip, a plurality of similar components, which are all produced simultaneously and later separated from each other. Lacquer masks are used as evaporation masks. A lacquer layer is first applied to the semiconductor surface illuminated with a photomask and developed. From this there results on a semiconductor surface a structured lacquer mask in the openings of which can be deposited by evaporation, for example, metal contacts. The lacquer masks have some disadvantages. Thus lacquer residues remain stuck to the surface, on deposition of the lacquer there exists, particularly in the case of thin chips, an increased danger of fracture, the lacquer masks process is expensive and requires an expensive lining-up process.

On the other hand, metal masks are known which, as compared with the lacquer masks, have advantages in some method operations but have to be lined up on the structures on the semiconductor surface in the same expensive manner. Expensive lining-up machines were developed for the lining-up processes.

SUMMARY OF THE INVENTION

It is an object of the invention to provide a mask by which the costly and expensive lining-up step is considerably simplified.

According to a first aspect of the invention, there is provided a mask for use in the production of a semiconductor arrangement comprising a mask element and a plurality of projections on said mask element on a side of the mask adapted to face said semiconductor arrangement for engagement in recesses in said semiconductor arrangement to position said mask element relative to said semiconductor arrangements.

According to a second aspect of the invention, there is provided a mask for use in production of a semiconductor arrangement, particularly evaporation masks for a semiconductor chip, characterised in that the mask is provided on its surface which is to face the semiconductor arrangement, with projections which are provided for the self-lining up of the mask for engagement in corresponding recesses in the surface of the semiconductor arrangement to be processed.

BRIEF DESCRIPTION OF THE DRAWINGS

The invention will now be described in greater detail by way of example with reference to the drawings, in which.

DESCRIPTION OF THE PREFERRED EMBODIMENTS

Basically, the invention proposes a mask for use in the production of a semiconductor arrangement in which the mask is provided on the surface intended to face the semiconductor arrangement, with projections which are provided for the self-alignment of the mask for the engagement in corresponding recesses in the surface of the semiconductor arrangement.

As a rule, in this case it is a question of metal masks. The new-type masks, when laid on the semiconductor surface, engage in the recesses present there so that the openings in the mask aligns with the associated points on the semiconductor surface. Any misalignment of the mask is excluded by the engagement between the projections of the mask and the recesses in the semiconductor arrangement.

Figure 1:
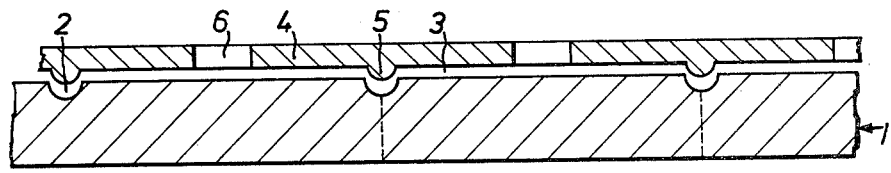
FIG. 1 is a sectional view of a semiconductor arrangement with a first form of mask according to the invention positioned thereon.

Referring now to the drawings, FIG. 1 shows a part of a semiconductor chip 1 which is provided at the surface with recesses 2. In this way the semiconductor surface is divided into mesa peaks 3 which contain diodes or transistors in known manner. For example, for the production of a metal contact to be deposited by evaporation, a metal mask 4, which is provided with projections 5, is lain on the semiconductor surface. The projections 5 engage in the recesses 2 so that the evaporation openings 6 in the mask lie above the predetermined points on the mesa peaks. Now the metal contacts can be deposited by evaporation through these mask openings.

Figure 2:
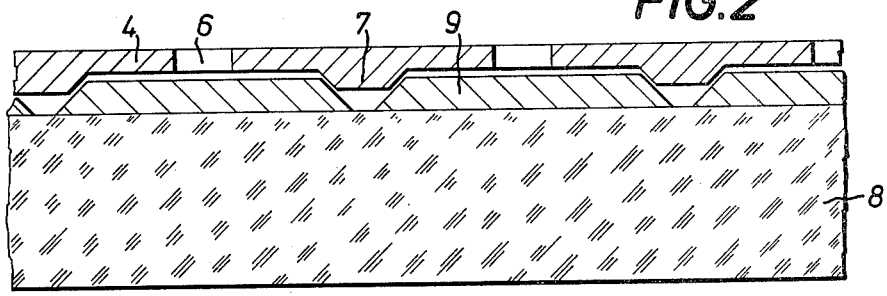
FIG. 2 is a view similar to FIG. 1 but showing a second form of mask according to the invention.

FIG. 2 shows a mask variant. The projections on the mask 4 themselves have the shape of mesa peaks 7. These projections engage in downwardly tapering notches on the surface of the semiconductor arrangement. Such a semiconductor arrangement is obtained for example by securing a very thin semiconductor layer on a carrier plate 8, for example of glass. This chip is parted by cuts reaching right up to the carrier plate for example by sawing. Thus, there result mesa-shaped semiconductor regions 9, which are insulated from each other and which are provided for the accommodation of semiconductor components, particularly diodes or transistors.

In the case of the arrangement according to FIG. 1, the projections on the mask are, for example, 10–60 μm thick, while the recesses in the semiconductor arrangement are 20–100 μm thick. The projections can be semispherical, mesa-shaped or of any other structure.

Figure 3:
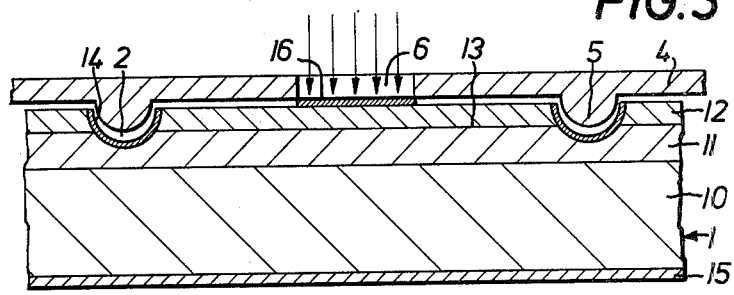
FIG. 3 is a sectional view of a semiconductor arrangement with a diode construction with a mask according to the invention positioned thereon.

FIG. 3 shows a semiconductor arrangement with diode structure. The semiconductor body comprises, to a large extent, the base body 10 of $n^+$-type conductivity which is provided at the surface with a thin, epitaxially deposited layer 11 of n-type conductivity. A region 12 of p-type conductivity is diffused into this layer. After this, mesa troughs 2, which reach beyond the pn-junction 13, are etched into the semiconductor body. The trough walls are covered with a glass passivation layer 14. The connection contact 15, of a thin metal layer, completely covering this semiconductor surface was applied in the rear side of the semiconductor body. Finally, the mask 4 is so lain on the surface of the semiconductor chip, which side is provided with the troughs 2, that its projections 5 engage in the recesses 2. After that the metal connection contact 16 for the region 12 of p-type conductivity is deposited by evaporation through the mask opening 6.

Figure 4:
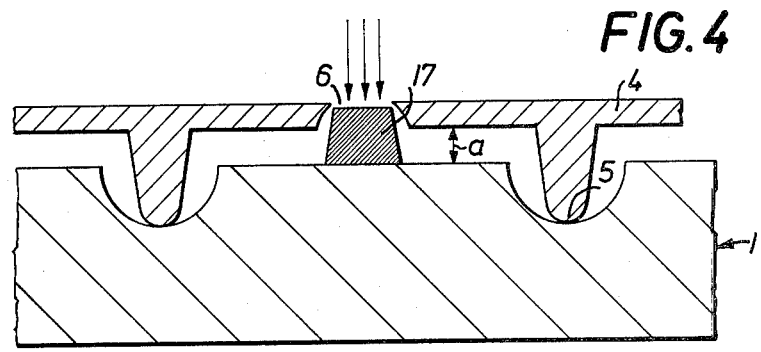
FIG. 4 is a section view of a semiconductor arrangement with a further form of mask in accordance with the invention.

FIG. 4 additionally shows a mask, the projections 5 of which are higher than the mesa peaks. The mask 4 then does not lie on the semiconductor surface but has a spacing $a$ to this surface. Now relatively high metal contact peaks 17, which are for exmaple 100 $\mu$m thick, can be deposited through the mask openings 6. In this case, it is for example a question of the known silver contact peaks on mesa diodes.

The important concept of the present invention consists in providing the masks necessary for the production of semiconductor arrangements with lining-up profiles which can be inserted into recesses present, given by the structure of the components or created separately. From this results a self lining-up effect and the complicatd lining-up with the help of lining-up devices while at the same time observing the lining-up operation is dispensed with.

However, for example, even certain regions of the semiconductor surface can be covered with insulating material layers with the help of the mask in accordance with the invention. The insulating material is then deposited by evaporation or pressed through the mask openings.

It will be understood that the above description of the present invention is susceptible to various modification changes and adaptations.

What is claimed is:

1. A mask for use in production of a semiconductor arrangement, particularly evaporation masks for a semiconductor chip, characterised in that the mask is provided on its surface which is to face the semiconductor arrangement, with projections which are provided for the self-lining up of the mask for engagement in corresponding recesses in the surface of the semiconductor arrangement to be processed.

2. A mask as defined in claim 1, wherein said mask comprises metal.

3. A method of producing a semiconductor arrangement including the steps of forming in a surface of said semiconductor arrangement a plurality of recesses, applying to said surface of said semiconductor arrangement a mask element with projections cooperating with said plurality of recesses to locate said mask element on said surface of said semiconductor arrangement and depositing connecting contacts by evaporation of metal through windows in said mask element onto said surface of said semiconductor arrangement.

4. A method of producing a semiconductor arrangement including the steps of forming in a surface of said semiconductor arrangement a plurality of recesses, applying to said surface of said semiconductor arrangement a mask element with projections cooperating with said plurality of recesses to locate said mask element on said surface of said semiconductor arrangement and depositing covering layers for certain regions of said surface of said semiconductor arrangement on said surface of said semiconductor arrangement through windows in said mask element.

5. A method as defined in claim 4, wherein said covers are deposited by evaporation.

6. A method as claimed in claim 5, wherein said covers are deposited by printing.

7. A method of producing a semiconductor arrangement including the steps of forming in a surface of said semiconductor arrangement a plurality of recesses to form mesa arrangements, applying to said surface of said surface of said semiconductor arrangement a mask element with projections cooperating with said plurality of recesses to locate said mask element relative to said surface of said semiconductor arrangement with said projections being longer than the depth of said plurality of recesses to space said mask element above said surface of said semiconductor arrangement and depositing thick metal peaks on surfaces of said mesa arrangements through windows in said mask element.

8. A mask for use in the production of a semiconductor arrangement comprising a mask element and a plurality of projections on said mask element on a side of the mask adapted to face said semiconductor arrangement for engagement in recesses in said semiconductor arrangement to position said mask element relative to said semiconductor arrangements.

* * * * *